(12) United States Patent
Li et al.

(10) Patent No.: US 12,196,789 B2
(45) Date of Patent: Jan. 14, 2025

(54) CURRENT SENSOR, CURRENT MEASUREMENT DEVICE, SYSTEM AND APPARATUS, AND STORAGE MEDIUM

(71) Applicant: DIGITAL GRID RESEARCH INSTITUTE, CHINA SOUTHERN POWER GRID, Guangzhou (CN)

(72) Inventors: Peng Li, Guangzhou (CN); Qiancheng Lv, Guangzhou (CN); Bing Tian, Guangzhou (CN); Licheng Li, Guangzhou (CN); Bofeng Luo, Guangzhou (CN); Zhong Liu, Guangzhou (CN); Zhiming Wang, Guangzhou (CN); Hongdi Sun, Guangzhou (CN); Xu Yin, Guangzhou (CN); Jiaming Zhang, Guangzhou (CN)

(73) Assignee: Digital Grid Research Institute, China S. Pwr Grid, Guangzhou (CN)

( * ) Notice: Subject to any disclaimer, the term of this patent is extended or adjusted under 35 U.S.C. 154(b) by 0 days.

(21) Appl. No.: 17/790,584

(22) PCT Filed: Jun. 16, 2021

(86) PCT No.: PCT/CN2021/100222
§ 371 (c)(1),
(2) Date: Jul. 1, 2022

(87) PCT Pub. No.: WO2022/193454
PCT Pub. Date: Sep. 22, 2022

(65) Prior Publication Data
US 2024/0110956 A1    Apr. 4, 2024

(30) Foreign Application Priority Data

Mar. 17, 2021   (CN) .......................... 202110284919.8

(51) Int. Cl.
*G01R 19/25* (2006.01)
*G01R 19/10* (2006.01)

(52) U.S. Cl.
CPC ............. *G01R 19/25* (2013.01); *G01R 19/10* (2013.01)

(58) Field of Classification Search
CPC ...... G01R 19/10; G01R 19/25; G01R 15/205; G01R 15/207; G01R 1/00; G01R 3/00;
(Continued)

(56) References Cited

U.S. PATENT DOCUMENTS

2011/0057650 A1   3/2011  Hellwig et al.
2012/0290240 A1*  11/2012  Fukui .................... G01R 15/20
                                                          702/65
(Continued)

FOREIGN PATENT DOCUMENTS

CN      102012446 A      4/2011
CN      102841232 A     12/2012
(Continued)

OTHER PUBLICATIONS

International Search Report for corresponding Application No. PCT/CN2021/100222 dated Dec. 24, 2021, 5 pages.
(Continued)

*Primary Examiner* — Feba Pothen
*Assistant Examiner* — Brent J Andrews
(74) *Attorney, Agent, or Firm* — Taft Stettinius & Hollister LLP

(57) ABSTRACT

A current sensor includes: four first uniaxial TMR chips and at least two second uniaxial TMR chips, each first uniaxial TMR chip and each second uniaxial TMR chip being located on the same virtual ring, wherein magnetic sensitive directions of the four first uniaxial TMR chips are perpendicular to a radius of the virtual ring, magnetic sensitive directions
(Continued)

of two adjacent first uniaxial TMR chips are perpendicular to each other, magnetic sensitive directions of the two second uniaxial TMR chips are parallel to the radius of the virtual ring and opposite to each other, and the two second uniaxial TMR chips respectively have the same positions as two first uniaxial TMR chips; each first uniaxial TMR chip and each second uniaxial TMR chip are configured to collect a magnetic induction intensity, the magnetic induction intensity is configured to calculate a target current value of a to-be-measured wire.

8 Claims, 5 Drawing Sheets

(58) Field of Classification Search
CPC .............. G01R 5/00; G01R 7/00; G01R 9/00; G01R 11/00; G01R 13/00; G01R 15/00; G01R 19/00; G01R 17/00; G01R 21/00; G01R 22/00; G01R 23/00; G01R 25/00; G01R 27/00; G01R 29/00; G01R 31/00; G01R 33/00; G01R 35/00
See application file for complete search history.

(56) References Cited

U.S. PATENT DOCUMENTS

| | | | |
|---|---|---|---|
| 2014/0177328 A1* | 6/2014 | Gerber | G11C 11/161 365/158 |
| 2017/0076743 A1* | 3/2017 | Hassan | G01R 33/093 |
| 2020/0064157 A1 | 2/2020 | Marauska et al. | |

FOREIGN PATENT DOCUMENTS

| | | |
|---|---|---|
| CN | 107328980 A | 11/2017 |
| CN | 109254191 A | 1/2019 |
| CN | 109283379 A | 1/2019 |
| CN | 109444510 A | 3/2019 |
| CN | 109521375 A | 3/2019 |
| CN | 109959816 A | 7/2019 |
| CN | 111398649 A | 7/2020 |
| CN | 111426870 A | 7/2020 |
| CN | 111458573 A | 7/2020 |
| CN | 111551776 A | 8/2020 |
| CN | 111624389 A | 9/2020 |
| CN | 111624531 A | 9/2020 |
| CN | 111650539 A | 9/2020 |
| CN | 111965579 A | 11/2020 |
| WO | 2015144541 A2 | 10/2015 |

OTHER PUBLICATIONS

Written Opinion for corresponding Application No. PCT/CN2021/100222 dated Dec. 24, 2021, 4 pages.
Chinese Office Action for corresponding Application No. 202110284919.8 dated Oct. 28, 2021, 8 pages.
Li Peng et al.,"Micro Current Measurement Technology Based on Tunnel Magnetoresistance", "Southern Power System Technology" vol. 13, No. 4, Apr. 30, 2019, 10 pages.
First Search document for corresponding Application No. 2021102849198 date of filing Mar. 17, 2021, 2 pages.

* cited by examiner

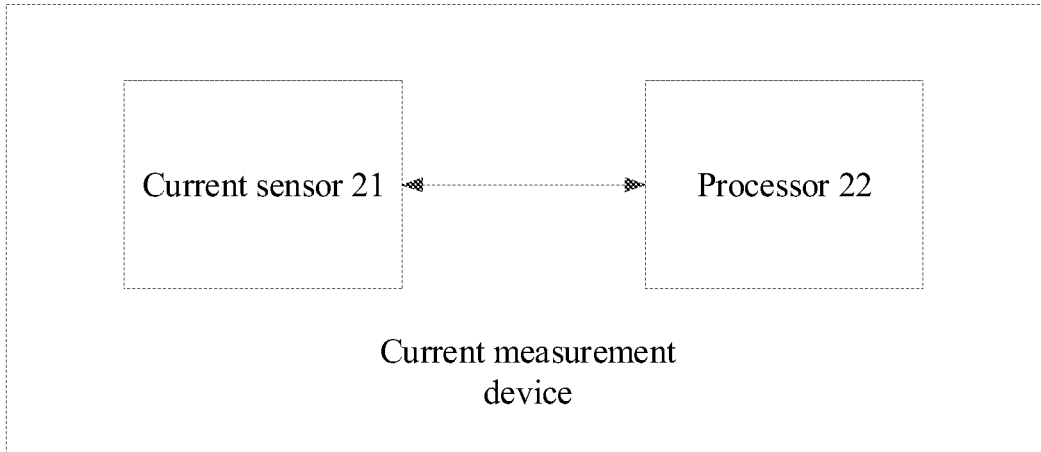

FIG. 2

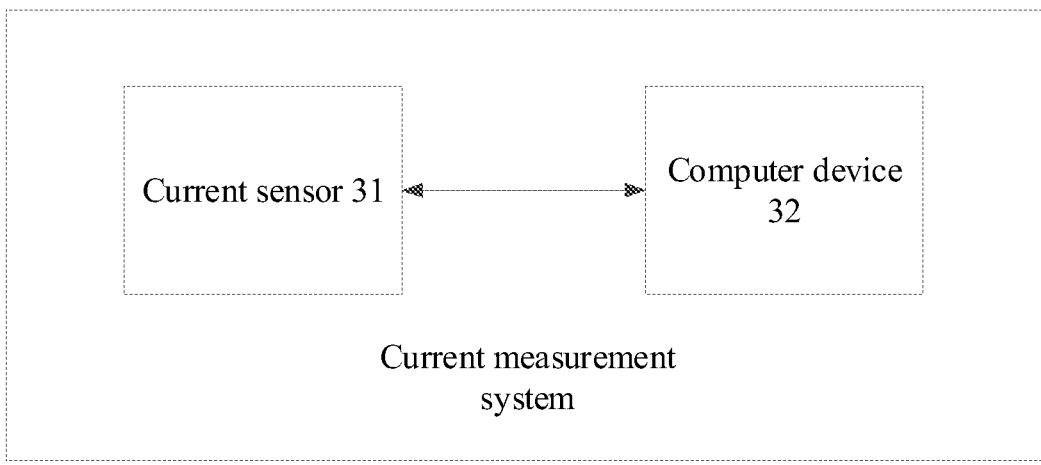

FIG. 3 the magnetic induction intensities of the four first uniaxial TMR chips and the magnetic induction intensities of at least two second uniaxial TMR chips are acquired — S402 the target current value of the to-be-measured wire is determined according to the magnetic induction intensity of each first uniaxial TMR chip, the magnetic induction intensity of each second uniaxial TMR chip, and the radius of the virtual ring — S404

CURRENT SENSOR, CURRENT MEASUREMENT DEVICE, SYSTEM AND APPARATUS, AND STORAGE MEDIUM

CROSS REFERENCE TO RELATED APPLICATIONS

This is a U.S. National Stage application of, and claims priority to, PCT/CN2021/100222, filed Jun. 16, 2021, which further claims priority to Chinese Patent Application No. 202110284919.8, filed Mar. 17, 2021, the disclosures of which are incorporated herein by reference in their entirety.

TECHNICAL FIELD

The present disclosure relates to the technical field of smart power grid, and particularly to a current sensor, a current measurement device, system and apparatus, and a storage medium.

BACKGROUND

The new generation of smart power grid has higher and higher requirements for sensing and monitoring of electrical and non-electrical quantities, but the existing means for measuring voltage, current and non-electrical quantities can no longer satisfy the requirements of the smart grid for comprehensive and real-time sensing information. For example, the accurate perception and prediction of the operating state of the power grid with the application of big data and artificial intelligence technology require the comprehensive collection of the electrical and non-electrical quantities (environmental parameters) in the power grid technology.

In the conventional technology, when the power system collects currents, it mainly relies on the current transformer based on the principle of electromagnetic coupling to measure the to-be-measured wire during the operation of the power grid, and the current transformer needs to be wired into the to-be-measured circuit to measure the current and collect the current value of the to-be-measured wire. However, the existing current measurement method has the problems of complicated testing and high costs.

SUMMARY

In view of this, as for the above-mentioned problem, it is necessary to provide a current sensor, current measurement device, system and apparatus, and a storage medium which can improve the measurement accuracy.

In the first aspect of the present disclosure, a current sensor is provided, including: four first uniaxial Tunnel Magnetoresistance (TMR) chips and at least two second uniaxial TMR chips, each of the first uniaxial TMR chips and each of the second uniaxial TMR chips being located on the same virtual ring, wherein magnetic sensitive directions of the four first uniaxial TMR chips are perpendicular to a radius of the virtual ring, magnetic sensitive directions of two adjacent first uniaxial TMR chips are perpendicular to each other, magnetic sensitive directions of the two second uniaxial TMR chips are parallel to the radius of the virtual ring and opposite to each other, and the two second uniaxial TMR chips respectively have the same positions as two of the first uniaxial TMR chips;
  each of the first uniaxial TMR chips and each of the second uniaxial TMR chips are configured to collect a magnetic induction intensity, the magnetic induction intensity is configured to calculate a target current value of a to-be-measured wire, the magnetic induction intensity comprises a magnetic induction intensity of the to-be-measured wire and an interference magnetic field intensity.

In the second aspect of the present disclosure, a current measurement device is provided, including the current sensor of claim 1, and a processor connected to the current sensor;
  the processor is configured to calculate the target current value of the to-be-measured wire according to the magnetic induction intensity and the radius of the virtual ring.

In the third aspect of the present disclosure, a current measurement system is provided, including the current sensor of claim 1, and a computer device connected to the current sensor;
  the computer device is configured to calculate the target current value of the to-be-measured wire according to the magnetic induction intensity and the radius of the virtual ring.

In the fourth aspect of the present disclosure, a current measurement method is provided, applied to the current measurement device in the first aspect or the current measurement system in the second aspect, the method includes:
  acquiring the magnetic induction intensities of the four first uniaxial TMR chips and the magnetic induction intensities of at least two second uniaxial TMR chips, a magnetic induction intensity comprising the magnetic induction intensity of the to-be-measured wire and the interference magnetic field intensity;
  determining the target current value of the to-be-measured wire according to the magnetic induction intensity of each first uniaxial TMR chip, the magnetic induction intensity of each second uniaxial TMR chip, and the radius of the virtual ring.

In an embodiment, the determining the target current value of the to-be-measured wire according to the magnetic induction intensity of each first uniaxial TMR chip, the magnetic induction intensity of each second uniaxial TMR chip, and the radius of the virtual ring includes:
  substituting the magnetic induction intensity of each first uniaxial TMR chip, the magnetic induction intensity of each second uniaxial TMR chip, and the radius of the virtual ring into a preset current calculation formula to calculate and obtain the target current value of the to-be-measured wire, wherein the current calculation formula is a corresponding relationship among a magnetic induction intensity variable, a virtual ring radius variable and a current value variable.

In an embodiment, an establishment method for the current calculation formula comprises:
  acquiring a radius included angle parameter between a radius at which each first uniaxial TMR chip is located and a radius at which the to-be-measured wire is located;
  acquiring a first distance parameter between each first uniaxial TMR chip and the to-be-measured wire;
  acquiring a magnetic field included angle parameter between a magnetic field direction of each first uniaxial TMR chip and a corresponding magnetic sensitive direction of each first uniaxial TMR chip;
  acquiring a second distance parameter between the to-be-measured wire and a center of the virtual ring;
  acquiring the interference magnetic field parameter;
  establishing the current calculation formula according to the radius included angle parameter, the first distance parameter, the magnetic field included angle parameter, the second distance parameter, and the interference magnetic field parameter.

In an embodiment, the determining the target current value of the to-be-measured wire according to the magnetic induction intensity of each first uniaxial TMR chip, the magnetic induction intensity of each second uniaxial TMR chip, and the radius of the virtual ring includes:

determining a plurality of candidate current measurement values according to the magnetic induction intensity of each first uniaxial TMR chip, the magnetic induction intensity of each second uniaxial TMR chip, and the radius of the virtual ring;

determining the target current value from the plurality of candidate current measurement values.

In an embodiment, the determining the target current value from the plurality of candidate current measurement values includes:

calculating a ratio of an imaginary part to a real part of each candidate current measurement value;

if the ratio is less than a preset threshold value, determining a candidate current measurement value corresponding to the ratio as the target current value.

In an embodiment, the determining the target current value from the plurality of candidate current measurement values includes:

determining a distance between the to-be-measured wire and the center of the ring corresponding to each candidate current measurement value according to each candidate current measurement value, the magnetic induction intensity of each first uniaxial TMR chip, the magnetic induction intensity of each second uniaxial TMR chip, and the radius of the virtual ring;

determining whether the distance between the to-be-measured wire and the center of the ring corresponding to each candidate current measurement value is less than R/2, wherein R represents the radius of the virtual ring;

if a distance between the to-be-measured wire and the center of the ring corresponding to a candidate current measurement value is less than R/2, determining the candidate current measurement value as the target current value.

In the fifth aspect of the present disclosure, a current measurement apparatus is provided, including:

an acquisition module, configured to acquire magnetic induction intensities of four first uniaxial TMR chips and magnetic induction intensities of at least two second uniaxial TMR chips;

a determination module, configured to determine a target current value of the to-be-measured wire according to a magnetic induction intensity of each first uniaxial TMR chip, a magnetic induction intensity of each second uniaxial TMR chip, and a radius of a virtual ring.

In the sixth aspect of the present disclosure, a computer-readable storage medium is provided, on which a computer program is stored, a processor, when executing the computer program, performs the method of any one of the above-mentioned embodiments in the fourth aspect.

In the above-mentioned current sensor, current measurement device, system and apparatus, and the storage medium, the current sensor includes: four first uniaxial TMR chips and at least two second uniaxial TMR chips, each of the first uniaxial TMR chips and each of the second uniaxial TMR chips being located on the same virtual ring, wherein magnetic sensitive directions of the four first uniaxial TMR chips are perpendicular to a radius of the virtual ring, magnetic sensitive directions of two adjacent first uniaxial TMR chips are perpendicular to each other, magnetic sensitive directions of the two second uniaxial TMR chips are parallel to the radius of the virtual ring and opposite to each other, and the two second uniaxial TMR chips respectively have the same positions as two of the first uniaxial TMR chips; each of the first uniaxial TMR chips and each of the second uniaxial TMR chips are configured to collect a magnetic induction intensity, the magnetic induction intensity is configured to calculate a target current value of a to-be-measured wire. Compared with the current transformer with the magnetic core, the uniaxial TMR chip is less expensive, and there is no need to connect the current sensor in series to the circuit to collect the current, and the measurement is simple.

BRIEF DESCRIPTION OF THE DRAWINGS

FIG. 2 is a structure block diagram illustrating a current measurement device according to an embodiment.

FIG. 3 is a structure block diagram illustrating a current measurement system according to an embodiment.

FIG. 4 is a flow chart showing a current measurement method according to an embodiment.

DETAILED DESCRIPTION

In order to make the purpose, the technical solution and advantages of the present disclosure clearer, the present disclosure will be further detailed with reference to the accompanying drawings and embodiments. It should be appreciated that specific embodiments described here are merely used for explanation of the present disclosure, rather than limiting the present disclosure.

Figure 1:
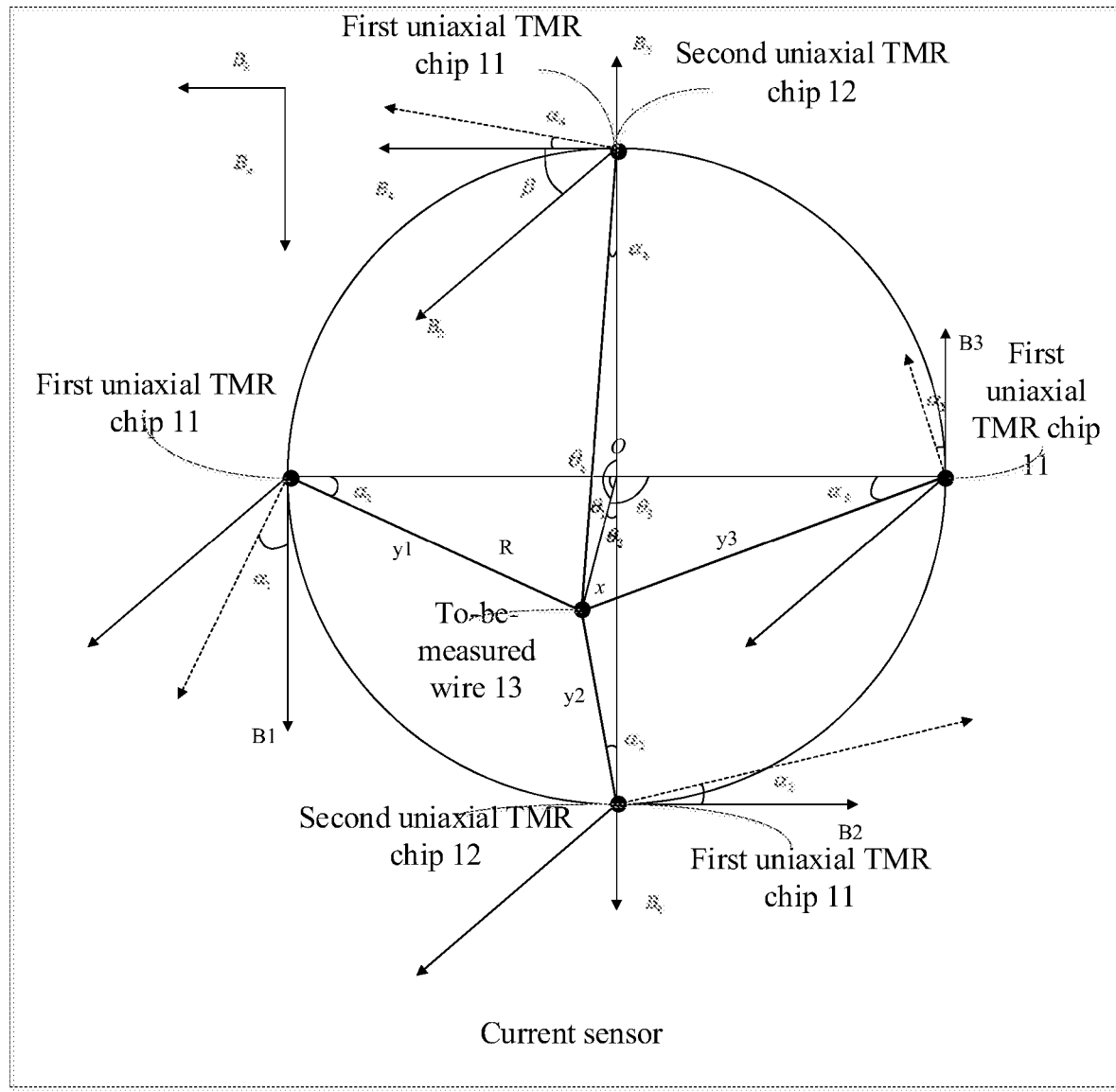
FIG. 1 is a structure block diagram illustrating a current sensor according to an embodiment.

FIG. 1 is a structure block diagram of a current sensor. In an embodiment, as shown in FIG. 1, a current sensor is provided. The current sensor includes: four first uniaxial Tunnel Magnetoresistance (TMR) chips 11 and at least two second uniaxial TMR chips 12. Each of the first uniaxial TMR chips and each of the second uniaxial TMR chips are located on the same virtual ring. Magnetic sensitive directions of the four first uniaxial TMR chips are all perpendicular to a radius of the virtual ring; and the magnetic sensitive directions of the two adjacent first uniaxial TMR chips are perpendicular to each other; the magnetic sensitive directions of the two second uniaxial TMR chips are parallel to the radius of the virtual ring and opposite to each other; and the two second uniaxial TMR chips respectively have the same positions as two of the first uniaxial TMR chips.

Each of the first uniaxial TMR chips and each of the second uniaxial TMR chips are configured to collect a magnetic induction intensity. The magnetic induction intensity is configured to calculate a target current value of a to-be-measured wire 13. The magnetic induction intensity includes a magnetic induction intensity of the to-be-measured wire and an interference magnetic field intensity.

The interfering magnetic field may include magnetic fields generated by other electrical devices adjacent to the to-be-measured wire.

Specifically, the current sensor includes at least six uniaxial TMR chips, namely four first uniaxial TMR chips and at least two second uniaxial TMR chips. All the uniaxial TMR chips are positioned on the same virtual ring; the magnetic sensitive directions of the four first uniaxial TMR chips are all perpendicular to the radius of the virtual ring; and the magnetic sensitive directions of two adjacent first uniaxial TMR chips are perpendicular to each other; the magnetic sensitive directions of the two second uniaxial TMR chips are parallel to the radius of the virtual ring and opposite to each other; the two second uniaxial TMR chips respectively have the same positions as two of the first uniaxial TMR chips. The four first uniaxial TMR chips are respectively denoted as a uniaxial TMR chip 1, a uniaxial TMR chip 2, a uniaxial TMR chip 3, and a uniaxial TMR chip 4. An included angle between two radiuses of the virtual ring where uniaxial TMR chip 1 and uniaxial TMR chip 2 are located is denoted as A=90 degrees; an included angle between two radiuses of the virtual ring where the uniaxial TMR chip 1 and the uniaxial TMR chip 3 are located is denoted as B=180 degrees. The position of each uniaxial TMR chip is relatively fixed, but can be positioned arbitrarily on the virtual ring; and the to-be-measured wire can be at any position within the virtual ring.

After each uniaxial TMR chip collects the magnetic induction intensity, the target current value of the to-be-measured wire can be determined according to the Biot-Savart law by using the magnetic induction intensity collected by each uniaxial TMR chip. As shown in FIG. 1, an included angle between the radius at which the uniaxial TMR chip 1 is located and the radius at which the to-be-measured wire is located is defined as $\theta_1$; an included angle between the radius at which the uniaxial TMR chip 2 is located and the radius at which the to-be-measured wire is located is defined as $\theta_2$; an included angle between the radius at which the uniaxial TMR chip 3 is located and the radius at which the to-be-measured wire is located is defined as $\theta_3$; an included angle between the radius at which the uniaxial TMR chip 4 is located and the radius at which the to-be-measured wire is located is defined as $\theta_4$. A distance between the uniaxial TMR chip 1 and the to-be-measured wire is defined as $y_1$; a distance between the uniaxial TMR chip 2 and the to-be-measured wire is defined as $y_2$; a distance between the uniaxial TMR chip 3 and the to-be-measured wire is defined as $y_3$; a distance between the uniaxial TMR chip 4 and the to-be-measured wire is defined as $y_4$. An included angle between the magnetic field direction and the magnetic sensitive direction of the uniaxial TMR chip 1 is defined as $\alpha_1$; an included angle between the magnetic field direction and the magnetic sensitive direction of the uniaxial TMR chip 2 is defined as $\alpha_2$; an included angle between the magnetic field direction and the magnetic sensitive direction of the uniaxial TMR chip 3 is defined as $\alpha_3$; an included angle between the magnetic field direction and the magnetic sensitive direction of the uniaxial TMR chip 4 is defined as $\alpha_4$. A distance between the to-be-measured wire and a center O of the ring is defined as x. Since each uniaxial TMR chip is arranged on the same virtual ring, the radius of the virtual ring is a known value. Considering that the distance between the external interference magnetic field and the sensor is larger than the distance between the external interference magnetic field and the chip, the magnetic field of the external interference magnetic field is the same at the chips adjacent to each other, and the interference magnetic field intensity is denoted as $\vec{B}_0 = \vec{B}_a + \vec{B}_b$. The following formulas are combined and simplified to obtain:

$$B_1 = I/y_1 \times \cos\alpha_1 \times M + B_a; \quad (1)$$

$$B_2 = I/y_2 \times \cos\alpha_2 \times M - B_b; \quad (2)$$

$$B_3 = I/y_3 \times \cos\alpha_3 \times M - B_a; \quad (3)$$

$$B_4 = I/y_4 \times \cos\alpha_4 \times M + B_b; \quad (4)$$

$$B_5 = I/y_4 \times \sin\alpha_4 \times M - B_a; \quad (5)$$

$$B_6 = I/y_2 \times \sin\alpha_2 \times M + B_a; \quad (6)$$

$$y_1 = \sqrt{R^2 + x^2 - 2Rx\cos\theta_1}; \quad (7)$$

$$y_2 = \sqrt{R^2 + x^2 - 2Rx\cos\theta_2}; \quad (8)$$

$$y_3 = \sqrt{R^2 + x^2 - 2Rx\cos\theta_3}; \quad (9)$$

$$y_4 = \sqrt{R^2 + x^2 - 2Rx\cos\theta_4}; \quad (10)$$

$$\theta_2 = A - \theta_1; \quad (11)$$

$$\theta_3 = B - \theta_1; \quad (12)$$

$$\theta_4 = A + \theta_1; \quad (13)$$

$$\cos\alpha_1 = \frac{R^2 + y_1^2 - x^2}{2 \cdot R \cdot y_1}; \quad (14)$$

$$\cos\alpha_2 = \frac{R^2 + y_2^2 - x^2}{2 \cdot R \cdot y_2}; \quad (15)$$

$$\cos\alpha_3 = \frac{R^2 + y_3^2 - x^2}{2 \cdot R \cdot y_3}; \quad (16)$$

$$\cos\alpha_4 = \frac{R^2 + y_4^2 - x^2}{2 \cdot R \cdot y_4}; \quad (17)$$

where $$M = \frac{\mu_0}{2\pi}$$

is a coefficient obtained according to the Biot-Savart law; an included angle between the radius of the virtual ring where the first uniaxial TMR chip is located and the radius of the virtual ring where the second uniaxial TMR chip is located is denoted as A=90 degrees; an included angle between the radius of the virtual ring where the first uniaxial TMR chip is located and the radius of the virtual ring where the third uniaxial TMR chip is located is denoted as B=180 degrees; accordingly a formula (18) can be obtained as follows:

$$a(I \cdot M)^7 + b(I \cdot M)^6 + c(I \cdot M)^5 + d(I \cdot M)^4 + e(I \cdot M)^3 + f(I \cdot M)^2 + g(I \cdot M) + h = 0$$

where, $$a = 4(B_1 + B_2 + B_3 + B_4)$$

$$b = -R\left(11(B_1 + B_2 + B_3 + B_4)^2 + 8(B_2 + B_4)(B_1 + B_3)\right)$$

$$c = 8R^2(B_1 + B_2 + B_3 + B_4)(B_2 + B_4)(B_1 + B_3) +$$

$$2R(B_1 + B_3 + B_2 + B_4)\left(3(B_1 + B_2 + B_3 + B_4)^2 + 8(B_2 + B_4)(B_1 + B_3)\right)R +$$

-continued $$R^2((B_1+B_3+B_2+B_4)^2+2((B_1+B_3)(B_2+B_4)+(B_5+B_6)^2))$$

$$4(B_1+B_2+B_3+B_4)$$

$$d = -4R^3(B_2+B_4)^2(B_1+B_3)^2 -$$

$$2R(B_1+B_3+B_2+B_4)8R^2(B_1+B_2+B_3+B_4)(B_2+B_4)(B_1+B_3) -$$

$$R^2((B_1+B_3+B_2+B_4)^2+2((B_1+B_3)(B_2+B_4)+(B_5+B_6)^2))$$

$$(3(B_1+B_2+B_3+B_4)^2+8(B_2+B_4)(B_1+B_3))R - 2R^3(B_1+B_3+B_2+B_4)$$

$$((B_1+B_3)(B_2+B_4)+(B_5+B_6)^2)4(B_1+B_2+B_3+B_4) -$$

$$((B_1+B_2+B_3+B_4)-2[(B_1+B_3)+R(B_5+B_6)^2])^2 * R$$

$$e = 2R(B_1+B_3+B_2+B_4)4R^3(B_2+B_4)^2(B_1+B_3)^2 +$$

$$R^2((B_1+B_3+B_2+B_4)^2+2((B_1+B_3)(B_2+B_4)+(B_5+B_6)^2))$$

$$8R^2(B_1+B_2+B_3+B_4)(B_2+B_4)(B_1+B_3) +$$

$$2R^3(B_1+B_3+B_2+B_4)((B_1+B_3)(B_2+B_4)+(B_5+B_6)^2)$$

$$(3(B_1+B_2+B_3+B_4)^2+8(B_2+B_4)(B_1+B_3)) * R +$$

$$R^4((B_1+B_3)(B_2+B_4)+(B_5+B_6)^2)^2 4(B_1+B_2+B_3+B_4) -$$

$$2((B_1+B_2+B_3+B_4)-2[(B_1+B_3)+R(B_5+B_6)^2])$$

$$\left( \begin{matrix} [(B_1+B_3)+R(B_5+B_6)^2]R(B_1+B_2+B_3+B_4) - \\ 2R(B_2+B_4)(B_1+B_3) \end{matrix} \right) * R$$

$$f = -R^2((B_1+B_3+B_2+B_4)^2+2((B_1+B_3)(B_2+B_4)+(B_5+B_6)^2))$$

$$4R^3(B_2+B_4)^2(B_1+B_3)^2 - 2R^3(B_1+B_3+B_2+B_4)$$

$$((B_1+B_3)(B_2+B_4)+(B_5+B_6)^2)8R^2(B_1+B_2+B_3+B_4)$$

$$(B_2+B_4)(B_1+B_3) - R^4((B_1+B_3)(B_2+B_4)+(B_5+B_6)^2)^2$$

$$(3(B_1+B_2+B_3+B_4)^2+8(B_2+B_4)(B_1+B_3)) * R -$$

$$([(B_1+B_3)+R(B_5+B_6)^2]R(B_1+B_2+B_3+B_4) -$$

$$2R(B_2+B_4)(B_1+B_3))^2 * R$$

$$g = 2R^3(B_1+B_3+B_2+B_4)((B_1+B_3)(B_2+B_4)+(B_5+B_6)^2)$$

$$4R^3(B_2+B_4)^2(B_1+B_3)^2 + R^4((B_1+B_3)(B_2+B_4)+(B_5+B_6)^2)^2$$

$$8R^2(B_1+B_2+B_3+B_4)(B_2+B_4)(B_1+B_3)$$

$$h = -R^4((B_1+B_3)(B_2+B_4)+(B_5+B_6)^2)^2 4R^3(B_2+B_4)^2(B_1+B_3)^2$$

Since $B_1$, $B_2$, $B_3$, $B_4$, $B_5$ and $B_6$ respectively represent the magnetic induction intensity of the uniaxial TMR chip 1, the magnetic induction intensity of the uniaxial TMR chip 2, the magnetic induction intensity of the uniaxial TMR chip 3, the magnetic induction intensity of the uniaxial TMR chip 4, and the magnetic induction intensity of the uniaxial TMR chip 5 and the magnetic induction intensity of the uniaxial TMR chip 6 in the second uniaxial TMR chip, and R represents the radius of the virtual ring, which are all known values. It can be seen from the above formulas that the to-be-measured current I can be obtained only according to seven values, namely $B_1$, $B_2$, $B_3$, $B_4$, $B_5$, $B_6$ and R. The formula (18) is solved by using the following formula (1):

$$I = eig \begin{bmatrix} -\frac{b}{a} & -\frac{c}{a} & -\frac{d}{a} & -\frac{e}{a} & -\frac{f}{a} & -\frac{g}{a} & -\frac{h}{a} \\ 1 & & & & & & \\ & 1 & & & & & \\ & & 1 & & & & \\ & & & 1 & & & \\ & & & & 1 & & \\ & & & & & 1 & \end{bmatrix} \quad (1)$$

where eig(·) represents finding eigenvectors of the matrix, i.e., the target current value. Candidate current measurement values can also be solved by using the formula (13); and a candidate current measurement value can be determined as the target current value when a ratio between an imaginary part and a real part of the selected candidate current measurement value is less than a preset threshold; and a candidate current measurement value in the case where the wire is positioned incorrectly is removed.

In the embodiment, the current sensor includes: four first uniaxial TMR chips and at least two second uniaxial TMR chips; each first uniaxial TMR chip and each second uniaxial TMR chip are positioned on the same virtual ring. The magnetic sensitive directions of the four first uniaxial TMR chips are all perpendicular to the radius of the virtual ring; and the magnetic sensitive directions of two adjacent first uniaxial TMR chips are perpendicular to each other. The magnetic sensitive directions of two second uniaxial TMR chips are parallel to the radius of the virtual ring and opposite to each other; and positions of the two second uniaxial TMR chips are respectively the same as positions of the two first uniaxial TMR chips. Each first uniaxial TMR chip and each second uniaxial TMR chip are both configured to collect the magnetic induction intensity; the magnetic induction intensity is configured to calculate the target current value of the to-be-measured wire. Since the price of the uniaxial TMR chip is lower than that of the current transformer with a magnetic core, and there is no need to connect the current sensor in series into the circuit to collect the current, the measurement is simple.

The current sensor is illustrated in the above embodiment. When the magnetic induction intensity collected by the current sensor as shown in FIG. 1 is configured to calculate the current value of the to-be-measured wire, the current value of the to-be-measured wire can be calculated by a processor connected to the current sensor. Now a current measurement device consisting of a current sensor and a processor is illustrated according to an embodiment. In an embodiment, as shown in FIG. 2, the current measurement device includes: a current sensor as shown in FIG. 1, a processor connected to the current sensor.

The processor is configured to calculate the target current value of the to-be-measured wire according to the magnetic induction intensity and the radius of the virtual ring.

Specifically, the processor can be connected to the current sensor in a wired or wireless manner to receive the magnetic induction intensity collected by each uniaxial TMR chip and sent from the current sensor. After the processor receives the magnetic induction intensity collected by each uniaxial TMR chip and sent from the current sensor, the target current value can be calculated by using the magnetic induction intensity collected by each uniaxial TMR chip and the radius of the virtual ring according to the calculation method for the target current value of the to-be-measured wire in the above embodiment.

In the embodiment, the current measurement device includes the current sensor and the processor connected to the current sensor; the processor calculates the target current value of the to-be-measured wire according to the magnetic induction intensity and the radius of the virtual circle. After the current sensor collects the magnetic induction intensity of the to-be-measured wire, the collected magnetic induction intensity is processed by the external processor to calculate the target current value of the to-be-measured wire, the measurement is simple, the structure of the current measurement device is simple, and the uniaxial TMR chip has a lower cost.

The current measurement device is illustrated in the above embodiment. When the current sensor as shown in FIG. 1 collects the magnetic induction intensity and the current value of the to-be-measured wire needs to be calculated, the calculation of the current value of the to-be-measured wire can also be implemented through a computer device connected to the current sensor. Now a current measurement system consisting of a current sensor and a computer device is illustrated according to an embodiment. In an embodiment, as shown in FIG. 3, the current measurement system includes: the current sensor shown in FIG. 1, and a computer device connected to the current sensor.

The computer device is configured to calculate the target current value of the to-be-measured wire according to the magnetic induction intensity and the radius of the virtual ring.

The computer device can include a server, which can be implemented by an independent server or a server cluster consisting of a plurality of servers. The computer device can also include a terminal; and the computer device includes a processor, a memory, a communication interface, a display screen and an input device connected through a system bus, and which may be, but not limited to, various personal computers, notebook computers, smart phones, tablet computers, and portable wearable devices.

Specifically, the computer device can be connected to the current sensor in a wired or wireless manner. After the computer device receives the magnetic induction intensity collected by each uniaxial TMR chip, the target current value can be calculated by using the magnetic induction intensity collected by each uniaxial TMR chip and the radius of the virtual ring according to the calculation method for the target current value of the to-be-measured wire in the above embodiment.

In the embodiment, the current measurement system includes a current sensor and a computer device connected to the current sensor. The computer device calculates the target current value of the to-be-measured wire according to the magnetic induction intensity and the radius of the virtual circle. After the current sensor collects the magnetic induction intensity of the to-be-measured wire, the collected magnetic induction intensity is processed by the external computer device to calculate the target current value of the to-be-measured wire, the measurement is simple, and the structure of the current measurement device is simple.

In the above embodiments, the current sensor, the current measurement device and the current measurement system are illustrated. The present disclosure provides a current measurement method that can be applied to the above current measurement device or current measurement system. Now how to calculate the current value of the to-be-measured wire is described according to an embodiment. In an embodiment, as shown in FIG. 4, the method applied to the current measurement device shown in FIG. 2 or the current measurement system shown in FIG. 3 includes following steps.

S402: the magnetic induction intensities of the four first uniaxial TMR chips and the magnetic induction intensities of at least two second uniaxial TMR chips are acquired; the magnetic induction intensity includes the magnetic induction intensity of the to-be-measured wire and the interference magnetic field intensity.

Specifically, an execution body is the processor as an example, the current sensor collects the magnetic induction intensity of each first uniaxial TMR chip and the magnetic induction intensity of each second uniaxial TMR chip, and transmits these magnetic induction intensities to the processor; then the processor can acquire the magnetic induction intensity of each first uniaxial TMR chip and the magnetic induction intensity of each second uniaxial TMR chip.

S404: the target current value of the to-be-measured wire is determined according to the magnetic induction intensity of each first uniaxial TMR chip, the magnetic induction intensity of each second uniaxial TMR chip, and the radius of the virtual ring.

Specifically, since each first uniaxial TMR chip and each second uniaxial TMR chip are positioned on the same virtual ring, and the radius of the virtual ring is a known value, the target current value can be solved by using the Biot-Savart law according to the magnetic induction intensity of each first uniaxial TMR chip, the magnetic induction intensity of each second uniaxial TMR chip, and the radius of the virtual ring. Alternatively, based on the magnetic induction intensity of each first uniaxial TMR chip, the magnetic induction intensity of each second uniaxial TMR chip, and radius of the virtual ring which are known, other relevant parameters are introduced to jointly construct an equation system, and the target current value can be obtained by simplifying and solving the equation system.

In the embodiment, the magnetic induction intensities of the four first uniaxial TMR chips and the magnetic induction intensities of at least two second uniaxial TMR chips are acquired; the target current value of the to-be-measured wire is determined according to the magnetic induction intensity of each first uniaxial TMR chip, the magnetic induction intensity of each second uniaxial TMR chip, and the radius of the virtual ring. Since the target current value of the to-be-measured wire can be determined according to only the magnetic induction intensity of each first uniaxial TMR chip, the magnetic induction intensity of each second uniaxial TMR chip, and the radius of the virtual ring, without acquiring actual values of other relevant parameters, the measurement method is simple and effective.

The current measurement method is described in the above-mentioned embodiment. Now how to determine the target current value of the to-be-measured wire according to the magnetic induction intensity of each uniaxial TMR chip and the radius of the virtual ring is further described. In an embodiment, the step of determining the target current value of the to-be-measured wire according to the magnetic induction intensity of each first uniaxial TMR chip, the magnetic induction intensity of each second uniaxial TMR chip, and the radius of the virtual ring includes the following step.

The magnetic induction intensity of each first uniaxial TMR chip, the magnetic induction intensity of each second uniaxial TMR chip, and the radius of the virtual ring are substituted into a preset current calculation formula to calculate and obtain the target current value of the to-be-measured wire; the current calculation formula is a corresponding relationship of a magnetic induction intensity variable, a virtual ring radius variable and a current value variable.

Figure 5:
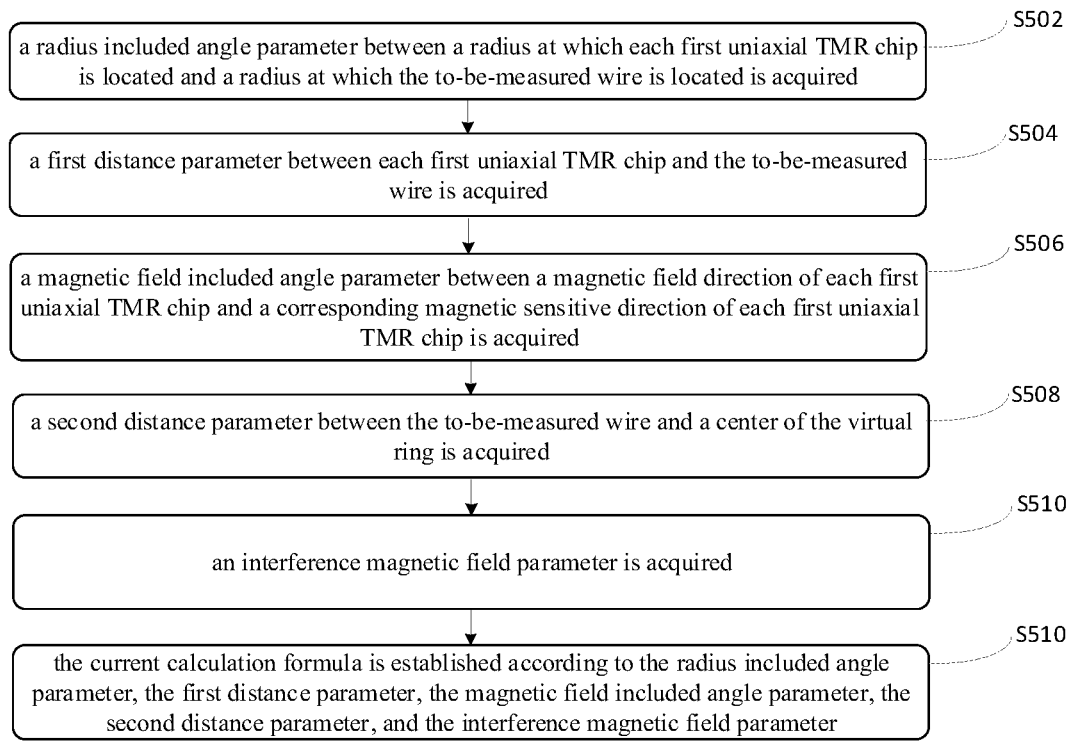
FIG. 5 is a flow chart showing a current measurement method according to another embodiment.

Specifically, the magnetic induction intensity of each uniaxial TMR chip and the known radius of the virtual ring are substituted into the current calculation formula, and target current value can be obtained by solving the current calculation formula. As for the construction method of the current calculation formula, reference can be made to the steps of the establishment method of the current calculation formula shown in FIG. 5, including:

S502: a radius included angle parameter between a radius at which each first uniaxial TMR chip is located and a radius at which the to-be-measured wire is located is acquired.

Specifically, after the position of each uniaxial TMR chip on the virtual ring is determined, an included angle between the radius at which the uniaxial TMR chip 1 is located and the radius at which the to-be-measured wire is located, an included angle between the radius at which the uniaxial TMR chip 2 is located and the radius at which the to-be-measured wire is located, an included angle between the radius at which the uniaxial TMR chip 3 is located and the radius at which the to-be-measured wire is located, and an included angle between the radius at which the uniaxial TMR chip 4 is located and the radius at which the to-be-measured wire is located are respectively defined as $\theta_1$, $\theta_2$, $\theta_3$, $\theta_4$; that is, a radius included angle parameter between the radius at which each first uniaxial TMR chip for the target current value is located and the radius at which the to-be-measured wire for the target current value is located is acquired.

S504: a first distance parameter between each first uniaxial TMR chip and the to-be-measured wire is acquired.

Specifically, after the position of each uniaxial TMR chip on the virtual ring is determined, a distance between the uniaxial TMR chip 1 and the to-be-measured wire, a distance between the uniaxial TMR chip 2 and the to-be-measured wire, a distance between the uniaxial TMR chip 3 and the to-be-measured wire, and a distance between the uniaxial TMR chip 4 and the to-be-measured wire are respectively defined as $y_1$, $y_2$, $y_3$, $y_4$; that is, the first distance parameter between each first uniaxial TMR chip for the target current value and the to-be-measured wire for the target current value is acquired.

S506: a magnetic field included angle parameter between a magnetic field direction of each first uniaxial TMR chip and a corresponding magnetic sensitive direction of each first uniaxial TMR chip is acquired.

Specifically, after the position of each uniaxial TMR chip on the virtual ring is determined, an included angle between the magnetic field direction of the uniaxial TMR chip 1 and the magnetic sensitive direction of the uniaxial TMR chip 1 is defined as $\alpha_1$; an included angle between the magnetic field direction of the uniaxial TMR chip 2 and the magnetic sensitive direction of the uniaxial TMR chip 2 is defined as $\alpha_2$; an included angle between the magnetic field direction of the uniaxial TMR chip 3 and the magnetic sensitive direction of the uniaxial TMR chip 3 is defined as $\alpha_3$; an included angle between the magnetic field direction of the uniaxial TMR chip 4 and the magnetic sensitive direction of the uniaxial TMR chip 4 is defined as $\alpha_4$; that is, the magnetic field included angel parameter between the magnetic field direction of each first uniaxial TMR chip for the target current value and the corresponding magnetic sensitive direction of each first uniaxial TMR chip for the target current value is acquired.

S508: a second distance parameter between the to-be-measured wire and a center of the virtual ring is acquired.

Specifically, after the position of each uniaxial TMR chip on the virtual ring is determined, the distance between the to-be-measured wire L and the center O of the ring can be defined as x, that is, the second distance parameter.

S510: an interference magnetic field parameter is acquired.

Specifically, considering that the distance between the external interference magnetic field and the sensor is greater than the distance between the external interference magnetic field and the chip, the external interference magnetic field is the same at the chips adjacent to each other, which is calculated as $\vec{B}_0 = \vec{B}_a + \vec{B}_b$, that is, the interference magnetic field parameter is acquired.

S512: the current calculation formula is established according to the radius included angle parameter, the first distance parameter, the magnetic field included angle parameter, the second distance parameter, and the interference magnetic field parameter.

Specifically, the current calculation formula can be established according to the radius included angle parameter, the first distance parameter, the magnetic field included angle parameter, the second distance parameter and the interference magnetic field parameter as follows:

$$B_1 = I/y_1 \times \cos\alpha_1 \times M + B_a, \quad (1)$$

$$B_2 = I/y_2 \times \cos\alpha_2 \times M - B_b, \quad (2)$$

$$B_3 = I/y_3 \times \cos\alpha_3 \times M - B_a, \quad (3)$$

$$B_4 = I/y_4 \times \cos\alpha_4 \times M + B_b, \quad (4)$$

$$B_5 = I/y_4 \times \sin\alpha_4 \times M - B_a, \quad (5)$$

$$B_6 = I/y_2 \times \sin\alpha_2 \times M + B_a, \quad (6)$$

$$y_1 = \sqrt{R^2 + x^2 - 2Rx\cos\theta_1}, \quad (7)$$

$$y_2 = \sqrt{R^2 + x^2 - 2Rx\cos\theta_2}, \quad (8)$$

$$y_3 = \sqrt{R^2 + x^2 - 2Rx\cos\theta_3}, \quad (9)$$

$$y_4 = \sqrt{R^2 + x^2 - 2Rx\cos\theta_4}, \quad (10)$$

$$\theta_2 = A - \theta_1, \quad (11)$$

$$\theta_3 = B - \theta_1, \quad (12)$$

$$\theta_4 = A + \theta_1, \quad (13)$$

$$\cos\alpha_1 = \frac{R^2 + y_1^2 - x^2}{2 \cdot R \cdot y_1}, \quad (14)$$

$$\cos\alpha_2 = \frac{R^2 + y_2^2 - x^2}{2 \cdot R \cdot y_2}, \quad (15)$$

$$\cos\alpha_3 = \frac{R^2 + y_3^2 - x^2}{2 \cdot R \cdot y_3}, \quad (16)$$

$$\cos\alpha_4 = \frac{R^2 + y_4^2 - x^2}{2 \cdot R \cdot y_4}; \quad (17)$$

$$M = \frac{\mu_0}{2\pi}$$

is a coefficient obtained according to the Biot-Savart law; the included angle between the radius of the virtual ring at which the first uniaxial TMR chip is located and the radius of the virtual ring at which the second uniaxial TMR chip is located is denoted as A=90 degrees; the included angle between the radius of the virtual ring at which the first uniaxial TMR chip is located and the radius of the virtual ring at which the third uniaxial TMR chip is located is denoted as B=180 degrees; the above formulas (1) to (17) are combined and simplified to obtain the formula (18) as follows:

$$a(l \cdot M)^7 + b(l \cdot M)^6 + c(l \cdot M)^5 + \qquad (18)$$
$$d(l \cdot M)^4 + e(l \cdot M)^3 + f(l \cdot M)^2 + g(l \cdot M) + h = 0,$$

$$a = 4(B_1 + B_2 + B_3 + B_4)$$

$$b = -R\big(11(B_1 + B_2 + B_3 + B_4)^2 + 8(B_2 + B_4)(B_1 + B_3)\big)$$

$$c = 8R^2(B_1 + B_2 + B_3 + B_4)(B_2 + B_4)(B_1 + B_3) +$$
$$2R(B_1 + B_3 + B_2 + B_4)\big(3(B_1 + B_2 + B_3 + B_4)^2 + 8(B_2 + B_4)(B_1 + B_3)\big)R +$$
$$R^2\big((B_1 + B_3 + B_2 + B_4)^2 + 2\big((B_1 + B_3)(B_2 + B_4) + (B_5 + B_6)^2\big)\big)$$
$$4(B_1 + B_2 + B_3 + B_4)$$

$$d = -4R^3(B_2 + B_4)^2(B_1 + B_3)^2 -$$
$$2R(B_1 + B_3 + B_2 + B_4)8R^2(B_1 + B_2 + B_3 + B_4)(B_2 + B_4)(B_1 + B_3) -$$
$$R^2\big((B_1 + B_3 + B_2 + B_4)^2 + 2\big((B_1 + B_3)(B_2 + B_4) + (B_5 + B_6)^2\big)\big)$$
$$\big(3(B_1 + B_2 + B_3 + B_4)^2 + 8(B_2 + B_4)(B_1 + B_3)\big)R - 2R^3(B_1 + B_3 + B_2 + B_4)$$
$$\big((B_1 + B_3)(B_2 + B_4) + (B_5 + B_6)^2\big)4(B_1 + B_2 + B_3 + B_4) -$$
$$\big((B_1 + B_2 + B_3 + B_4) - 2\big[(B_1 + B_3) + R(B_5 + B_6)^2\big]\big)^2 * R$$

$$e = 2R(B_1 + B_3 + B_2 + B_4)4R^3(B_2 + B_4)^2(B_1 + B_3)^2 +$$
$$R^2\big((B_1 + B_3 + B_2 + B_4)^2 + 2\big((B_1 + B_3)(B_2 + B_4) + (B_5 + B_6)^2\big)\big)$$
$$8R^2(B_1 + B_2 + B_3 + B_4)(B_2 + B_4)(B_1 + B_3) +$$
$$2R^3(B_1 + B_3 + B_2 + B_4)\big((B_1 + B_3)(B_2 + B_4) + (B_5 + B_6)^2\big)$$
$$\big(3(B_1 + B_2 + B_3 + B_4)^2 + 8(B_2 + B_4)(B_1 + B_3)\big) * R +$$
$$R^4\big((B_1 + B_3)(B_2 + B_4) + (B_5 + B_6)^2\big)^2 4(B_1 + B_2 + B_3 + B_4) -$$
$$2\big((B_1 + B_2 + B_3 + B_4) - 2\big[(B_1 + B_3) + R(B_5 + B_6)^2\big]\big)$$
$$\left(\begin{array}{l}[(B_1 + B_3) + R(B_5 + B_6)^2]R(B_1 + B_2 + B_3 + B_4) - \\ 2R(B_2 + B_4)(B_1 + B_3)\end{array}\right) * R$$

$$f = -R^2\big((B_1 + B_3 + B_2 + B_4)^2 + 2\big((B_1 + B_3)(B_2 + B_4) + (B_5 + B_6)^2\big)\big)$$
$$4R^3(B_2 + B_4)^2(B_1 + B_3)^2 - 2R^3(B_1 + B_3 + B_2 + B_4)$$
$$\big((B_1 + B_3)(B_2 + B_4) + (B_5 + B_6)^2\big)8R^2(B_1 + B_2 + B_3 + B_4)$$
$$(B_2 + B_4)(B_1 + B_3) - R^4\big((B_1 + B_3)(B_2 + B_4) + (B_5 + B_6)^2\big)^2$$
$$\big(3(B_1 + B_2 + B_3 + B_4)^2 + 8(B_2 + B_4)(B_1 + B_3)\big) * R -$$
$$\big([(B_1 + B_3) + R(B_5 + B_6)^2]R(B_1 + B_2 + B_3 + B_4) -$$
$$2R(B_2 + B_4)(B_1 + B_3)\big)^2 * R$$

$$g = 2R^3(B_1 + B_3 + B_2 + B_4)\big((B_1 + B_3)(B_2 + B_4) + (B_5 + B_6)^2\big)$$
$$4R^3(B_2 + B_4)^2(B_1 + B_3)^2 + R^4\big((B_1 + B_3)(B_2 + B_4) + (B_5 + B_6)^2\big)^2$$
$$8R^2(B_1 + B_2 + B_3 + B_4)(B_2 + B_4)(B_1 + B_3)$$

$$h = -R^4\big((B_1 + B_3)(B_2 + B_4) + (B_5 + B_6)^2\big)^2 4R^3(B_2 + B_4)^2(B_1 + B_3)^2$$

Since $B_1$, $B_2$, $B_3$, $B_4$, $B_5$ and $B_6$ respectively represent the magnetic induction intensities of the uniaxial TMR chip 1, the uniaxial TMR chip 2, the uniaxial TMR chip 3, and the uniaxial TMR chip 4, and the magnetic induction intensities of the uniaxial TMR chip 5 and the uniaxial TMR chip 6 in the second uniaxial TMR chip; R represents the radius of the virtual ring, which are all known values, it can be seen from the above formulas that the current I to be measured can be obtained only according to the eight values, namely $B_1$, $B_2$, $B_3$, $B_4$, $B_5$, $B_6$ and R. The formula (18) can be solved through the formula (1):

$$I = eig \begin{bmatrix} -\frac{b}{a} & -\frac{c}{a} & -\frac{d}{a} & -\frac{e}{a} & -\frac{f}{a} & -\frac{g}{a} & -\frac{h}{a} \\ 1 & & & & & & \\ & 1 & & & & & \\ & & 1 & & & & \\ & & & 1 & & & \\ & & & & 1 & & \\ & & & & & 1 & \end{bmatrix}, \qquad (1)$$

to obtain the target current value.

In the embodiment, by substituting the magnetic induction intensity of each first uniaxial TMR chip, the magnetic induction intensity of each second uniaxial TMR chip, and the radius of the virtual ring into the preset current calculation formula, the target current value of the to-be-measured wire is obtained by the calculation. Such method is simple and effective, and the target current value of the to-be-measured wire with a higher accuracy can be obtained. Further, in the process of constructing the current calculation formula, the introduced interference magnetic field parameters are eliminated, so that the external interference magnetic field does not need to be considered in the final calculation process, which means that the method has an anti-interference characteristic. Meanwhile, since the calculation process is only related to the magnetic induction intensity of the to-be-measured wire collected by each uniaxial TMR chip and the radius of the ring, the calculation process is not easily affected by other parameters and is more accurate. Accordingly, the measured target current value is more accurate, and the measurement result is more accurate.

Figure 6:
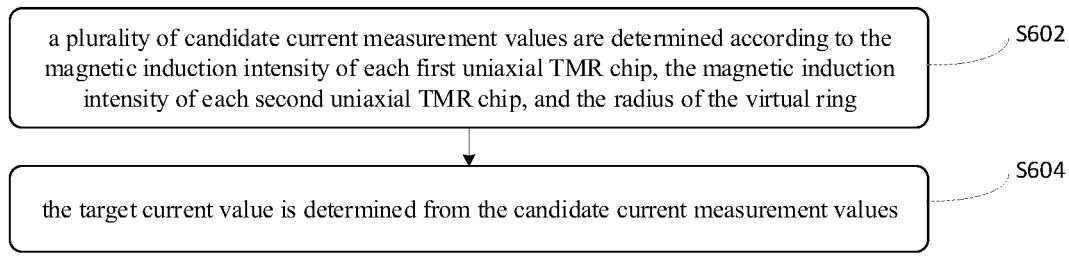
FIG. 6 is a flow chart showing a current measurement method according to another embodiment.

The current measurement method is described in the above embodiment, and now how to determine the target current value is further detailed below. In an embodiment, as shown in FIG. 6, the step of determine the target current value of the to-be-measured wire according to the magnetic induction intensity of each first uniaxial TMR chip, the magnetic induction intensity of each second uniaxial TMR chip and the radius of the virtual ring includes following steps.

S602: a plurality of candidate current measurement values are determined according to the magnetic induction intensity of each first uniaxial TMR chip, the magnetic induction intensity of each second uniaxial TMR chip, and the radius of the virtual ring.

Specifically, the magnetic induction intensity of each first uniaxial TMR chip, the magnetic induction intensity of each second uniaxial TMR chip, and the radius of the virtual ring are substituted into the current calculation formula constructed in the above embodiment:

$$a(I \cdot M)^7 + b(I \cdot M)^6 + c(I \cdot M)^5 + d(I \cdot M)^4 + e(I \cdot M)^3 + f(I \cdot M)^2 + g(I \cdot M) + h = 0$$

where $$M = \frac{\mu_0}{2\pi}$$

is a coefficient obtained according to the Biot-Savart law;

$$a = 4(B_1 + B_2 + B_3 + B_4)$$

$$b = -R\big(11(B_1 + B_2 + B_3 + B_4)^2 + 8(B_2 + B_4)(B_1 + B_3)\big)$$

$$c = 8R^2(B_1 + B_2 + B_3 + B_4)(B_2 + B_4)(B_1 + B_3) +$$

$$2R(B_1 + B_3 + B_2 + B_4)\big(3(B_1 + B_2 + B_3 + B_4)^2 + 8(B_2 + B_4)(B_1 + B_3)\big)R +$$

$$R^2\big((B_1 + B_3 + B_2 + B_4)^2 + 2\big((B_1 + B_3)(B_2 + B_4) + (B_5 + B_6)^2\big)\big)$$

$$d = -4R^3(B_2 + B_4)^2(B_1 + B_3)^2 - \frac{4(B_1 + B_2 + B_3 + B_4)}{\begin{array}{c}2R(B_1 + B_3 + B_2 + B_4)8R^2(B_1 + B_2 + B_3 + B_4)(B_2 + B_4)(B_1 + B_3) - \\ R^2\big((B_1 + B_3 + B_2 + B_4)^2 + 2\big((B_1 + B_3)(B_2 + B_4) + (B_5 + B_6)^2\big)\big)\end{array}}$$

$$\big(3(B_1 + B_2 + B_3 + B_4)^2 + 8(B_2 + B_4)(B_1 + B_3)\big)R - 2R^3(B_1 + B_3 + B_2 + B_4)$$

$$\big((B_1 + B_3)(B_2 + B_4) + (B_5 + B_6)^2\big)4(B_1 + B_2 + B_3 + B_4) -$$

$$\big((B_1 + B_2 + B_3 + B_4) - 2\big[(B_1 + B_3) + R(B_5 + B_6)^2\big]\big)^2 * R$$

$$e = 2R(B_1 + B_3 + B_2 + B_4)4R^3(B_2 + B_4)^2(B_1 + B_3)^2 +$$

$$R^2\big((B_1 + B_3 + B_2 + B_4)^2 + 2\big((B_1 + B_3)(B_2 + B_4) + (B_5 + B_6)^2\big)\big)$$

$$8R^2(B_1 + B_2 + B_3 + B_4)(B_2 + B_4)(B_1 + B_3) +$$

$$2R^3(B_1 + B_3 + B_2 + B_4)\big((B_1 + B_3)(B_2 + B_4) + (B_5 + B_6)^2\big)$$

$$\big(3(B_1 + B_2 + B_3 + B_4)^2 + 8(B_2 + B_4)(B_1 + B_3)\big) * R +$$

$$R^4\big((B_1 + B_3)(B_2 + B_4) + (B_5 + B_6)^2\big)^2 4(B_1 + B_2 + B_3 + B_4) -$$

$$2\big((B_1 + B_2 + B_3 + B_4) - 2\big[(B_1 + B_3) + R(B_5 + B_6)^2\big]\big)$$

$$\left(\begin{array}{c}\big[(B_1 + B_3) + R(B_5 + B_6)^2\big]R(B_1 + B_2 + B_3 + B_4) - \\ 2R(B_2 + B_4)(B_1 + B_3)\end{array}\right) * R$$

$$f = -R^2\big((B_1 + B_3 + B_2 + B_4)^2 + 2\big((B_1 + B_3)(B_2 + B_4) + (B_5 + B_6)^2\big)\big)$$

$$4R^3(B_2 + B_4)^2(B_1 + B_3)^2 - 2R^3(B_1 + B_3 + B_2 + B_4)$$

$$\big((B_1 + B_3)(B_2 + B_4) + (B_5 + B_6)^2\big)8R^2(B_1 + B_2 + B_3 + B_4)$$

$$(B_2 + B_4)(B_1 + B_3) - R^4\big((B_1 + B_3)(B_2 + B_4) + (B_5 + B_6)^2\big)^2$$

$$\big(3(B_1 + B_2 + B_3 + B_4)^2 + 8(B_2 + B_4)(B_1 + B_3)\big) * R -$$

$$\big(\big[(B_1 + B_3) + R(B_5 + B_6)^2\big]R(B_1 + B_2 + B_3 + B_4) -$$

$$2R(B_2 + B_4)(B_1 + B_3)\big)^2 * R$$

$$g = 2R^3(B_1 + B_3 + B_2 + B_4)\big((B_1 + B_3)(B_2 + B_4) + (B_5 + B_6)^2\big)$$

$$4R^3(B_2 + B_4)^2(B_1 + B_3)^2 + R^4\big((B_1 + B_3)(B_2 + B_4) + (B_5 + B_6)^2\big)^2$$

$$8R^2(B_1 + B_2 + B_3 + B_4)(B_2 + B_4)(B_1 + B_3)$$

$$h = -R^4\big((B_1 + B_3)(B_2 + B_4) + (B_5 + B_6)^2\big)^2 4R^3(B_2 + B_4)^2(B_1 + B_3)^2.$$

Since $B_1$, $B_2$, $B_3$, $B_4$, $B_5$ and $B_6$ respectively represent the magnetic induction intensities of the uniaxial TMR chip 1, the uniaxial TMR chip 2, the uniaxial TMR chip 3 and the uniaxial TMR chip 4, and the magnetic induction intensities of the uniaxial TMR chip 5 and the uniaxial TMR chip 6 in the second uniaxial TMR chip; and R represents the radius of the virtual ring, which are all known values, it can be seen from the above formula that the current I to be measured can be obtained only according to the eight values, namely the $B_1$, $B_2$, $B_3$, $B_4$, $B_5$, $B_6$ and R. The formula (18) can be solved through the formula (1):

$$I = eig\begin{bmatrix} -\frac{b}{a} & -\frac{c}{a} & -\frac{d}{a} & -\frac{e}{a} & -\frac{f}{a} & -\frac{g}{a} & -\frac{h}{a} \\ 1 & & & & & & \\ & 1 & & & & & \\ & & 1 & & & & \\ & & & 1 & & & \\ & & & & 1 & & \\ & & & & & 1 & \end{bmatrix}, \quad (1)$$

and seven solutions can be obtained, i.e., seven candidate current measurement values.

S604: the target current value is determined from the candidate current measurement values.

Specifically, since the current calculation formula is solved through the formula (1)

$$I = eig\begin{bmatrix} -\frac{b}{a} & -\frac{c}{a} & -\frac{d}{a} & -\frac{e}{a} & -\frac{f}{a} & -\frac{g}{a} & -\frac{h}{a} \\ 1 & & & & & & \\ & 1 & & & & & \\ & & 1 & & & & \\ & & & 1 & & & \\ & & & & 1 & & \\ & & & & & 1 & \end{bmatrix},$$

where eig(·) is represents finding an eigenvector of the matrix, i.e., one of the seven candidate current measurement values, which can serve as the target current value. It is also possible to calculate a ratio of an imaginary part to a real part of each candidate current measurement value. If the ratio is less than a preset threshold, the candidate current measurement value is determined as the target current value; and a distance between the to-be-measured wire and the center of the ring corresponding to each candidate current measurement value is determined according to each candidate current measurement value, the magnetic induction intensity of each first uniaxial TMR chip, the magnetic induction intensity of each second uniaxial TMR chip, and the radius of the virtual ring; and then the distance between the to-be-measured wire and the center of the ring corresponding to the candidate current measurement value which is less than R/2 is selected as the target current value, and R represents the radius of the virtual ring.

In the embodiment, a plurality of candidate current measurement values are determined according to the magnetic induction intensity of each first uniaxial TMR chip, the magnetic induction intensity of each second uniaxial TMR chip, and the radius of the virtual ring; and the target current value is determined from the candidate current measurement values. Accordingly, the optimal target current value can be selected and the more accurate measurement result can be obtained.

Figure 7:
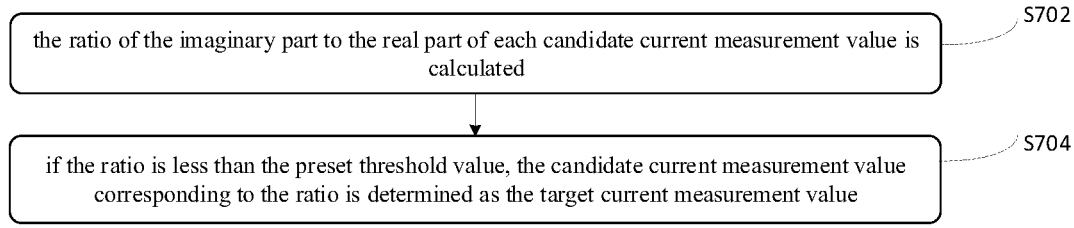
FIG. 7 is a flow chart showing a current measurement method according to another embodiment.

The above embodiment describes the current measurement method, through which a plurality of candidate current measurement values can be determined. Therefore, it is necessary to further select the optimal target current value from the plurality of candidate current measurement values. How to determine the target current value is now described below. In an embodiment, as shown in FIG. 7, the step of determining the target current value from the candidate current measurement values includes followings steps.

S702: the ratio of the imaginary part to the real part of each candidate current measurement value is calculated.

Specifically, the imaginary part and the real part of each candidate current measurement value can be determined, and the ratio of the imaginary part to the real part of each candidate current measurement value can be calculated.

S704: if the ratio is less than the preset threshold value, the candidate current measurement value corresponding to the ratio is determined as the target current value.

Specifically, a calculated ratio of the imaginary part to the real part of each candidate current measurement value is compared to the preset threshold value, and a candidate current measurement value corresponding to a ratio less than the preset threshold value is selected as the target measurement-value. For example, when the candidate current measurement value $$I \ne 0, \frac{\text{imaginary part}}{\text{real part}} < 0.1,$$

the candidate current measurement value is determined as the real part target current value.

In the embodiment, by calculating the ratio of the imaginary part to the real part of each candidate current measurement value, if the ratio is smaller than the preset threshold value, the candidate current measurement value is determined as the target current value.

Accordingly, more accurate measurement result can be obtained.

Figure 8:
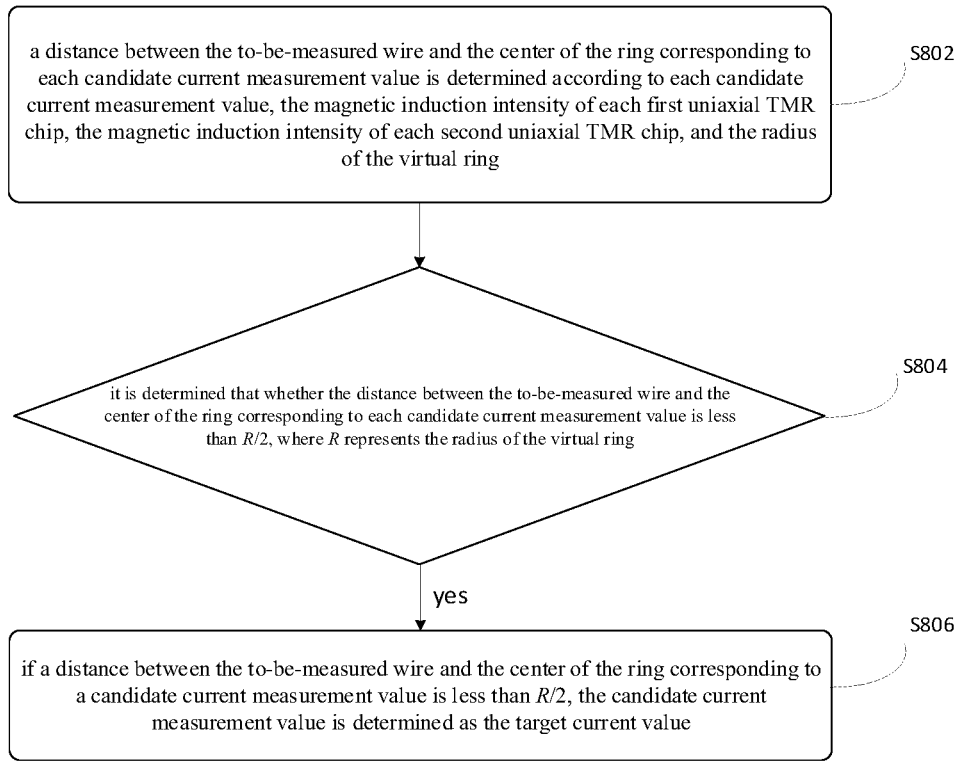
FIG. 8 is a flow chart showing a current measurement method according to another embodiment.

The above embodiment describes the current measurement method, through which a plurality of candidate current measurement values can be determined. Therefore, it is necessary to further select an optimal target current value from the plurality of candidate current measurement values. How to determine the target current value is now further detailed below. As shown in FIG. 8, the step of determining the target current value from the candidate current measurement values includes following steps.

S802: a distance between the to-be-measured wire and the center of the ring corresponding to each candidate current measurement value is determined according to each candidate current measurement value, the magnetic induction intensity of each first uniaxial TMR chip, the magnetic induction intensity of each second uniaxial TMR chip, and the radius of the virtual ring.

Specifically, each candidate current measurement value I, the magnetic induction intensities of the uniaxial TMR chip 1, the uniaxial TMR chip 2, the uniaxial TMR chip 3, and the uniaxial TMR chip 4 in the first uniaxial TMR chip, the magnetic induction intensities of the uniaxial TMR chip 5 and the uniaxial TMR chip 6 in the second uniaxial TMR chip, and the radius R of the virtual ring are substituted into the following formula:

$$x^4 = \frac{[4R^3 IM^2 - 3R^4 IM(B_1 + B_2 + B_3 + B_4) + 2R^5(B_2 + B_4)(B_1 + B_3)]}{[IM(B_1 + B_2 + B_3 + B_4) - 2R(B_2 + B_4)(B_1 + B_3)]},$$

to calculate the distance x between the to-be-measured wire and the center of the ring corresponding to each candidate current measurement value.

S804: it is determined that whether the distance between the to-be-measured wire and the center of the ring corresponding to each candidate current measurement value is less than R/2, where R represents the radius of the virtual ring.

Specifically, it is determined that whether the distance between the to-be-measured wire and the center of the ring corresponding to each candidate current measurement value minus R/2 is negative, or whether the distance between the to-be-measured wire and the center of the ring corresponding to each candidate current measurement value divided by R/2 is less than 1.

S806: if a distance between the to-be-measured wire and the center of the ring corresponding to a candidate current measurement value is less than R/2, the candidate current measurement value is determined as the target current value.

Specifically, if a distance between the to-be-measured wire and the center of the ring corresponding to a candidate current measurement value is less than R/2, the candidate current measurement value is determined as the target current value.

In the embodiment, the distance between the to-be-measured wire and the center of the ring corresponding to each candidate current measurement value is determined according to each candidate current measurement value, the magnetic induction intensity of each first uniaxial TMR chip, the magnetic induction intensity of each second uniaxial TMR chip, and the radius of the virtual ring; it is determined whether the distance between the to-be-measured wire and the center of the ring corresponding to each candidate current measurement value is less than R/2, where R is the radius of the virtual ring; if the distance between the to-be-measured wire and the center of the ring corresponding to each candidate current measurement value is less than R/2, the candidate current measurement value is determined as the target current value; accordingly, the optimal target current value can be determined.

In order to facilitate the understanding of those skilled in the art, the current measurement method is further described in an embodiment, and the current measurement method includes following steps.

S902: a radius included angle parameter between a radius at which each first uniaxial TMR chip is located and a radius at which the to-be-measured wire is located is acquired.

S904: a first distance parameter between each first uniaxial TMR chip and the to-be-measured wire is acquired.

S906: a magnetic field included angle parameter between a magnetic field direction of each first uniaxial TMR chip and a corresponding magnetic sensitive direction of each first uniaxial TMR chip is acquired.

S908: a second distance parameter between the to-be-measured wire and the center of the virtual ring is acquired.

S910: an interference magnetic field parameter is acquired.

S912: a current calculation formula is established according to the radius included angle parameter, the first distance parameter, the magnetic field included angle parameter, the second distance parameter, and the interference magnetic field parameter.

S914: magnetic induction intensities of four first uniaxial TMR chips and magnetic induction intensities of at least two second uniaxial TMR chips are acquired.

S916: the target current value of the to-be-measured wire is determined according to the magnetic induction intensity of each first uniaxial TMR chip, the magnetic induction intensity of each second uniaxial TMR chip, and the radius of the virtual ring.

S918: a plurality of candidate current measurement values are determined according to the magnetic induction intensity of each first uniaxial TMR chip, the magnetic induction intensity of each second uniaxial TMR chip, and the radius of the virtual ring.

S920: the ratio of the imaginary part to the real part of each candidate current measurement value is calculated.

S922: if the ratio is less than the preset threshold value, the candidate current measurement value is determined as the target current value.

S924: the distance between the to-be-measured wire and the center of the ring corresponding to each candidate current measurement value is determined according to each candidate current measurement value, the magnetic induction intensity of each first uniaxial TMR chip, the magnetic induction intensity of each second uniaxial TMR chip, and the radius of the virtual ring.

S926: it is determined whether the distance between the to-be-measured wire and the center of the ring according to each candidate current measurement value is less than R/2, where R is the radius of the virtual circle.

S928: if a distance between the to-be-measured wire and the center of the ring according to a candidate current measurement value is less than R/2, the candidate current measurement value is determined as the target current value.

In the embodiment, the magnetic induction intensities of four first uniaxial TMR chips and the magnetic induction intensities of at least two second uniaxial TMR chips acquired; the target current value of the to-be-measured wire is determined according to the magnetic induction intensity of each first uniaxial TMR chip, the magnetic induction intensity of each second uniaxial TMR chip, and the radius of the virtual ring. Since the target current value of the to-be-measured wire can be determined only according to the magnetic induction intensity of each first uniaxial TMR chip, the magnetic induction intensity of each second uniaxial TMR chip, and the radius of the virtual ring at which each uniaxial TMR chip is located, without needing to acquire actual values of other related parameters. Accordingly, the measurement method is simple and effective.

It should be appreciated that although the steps in the flowcharts in FIGS. 4 to 8 are shown in sequence according to the arrows, these steps are not definitely executed in the sequence shown by the arrows. Unless explicitly stated herein, the execution of these steps is not strictly limited to the order, and these steps can be performed in other orders. Moreover, at least a part of the steps in FIGS. 4 to 8 may include multiple steps or multiple stages. These steps or stages are not definitely executed and completed at the same time, but may be executed at different time. These steps or stages are also not definitely performed sequential, but may be performed in turns or alternately with other steps or at least part of the steps or stages within the other steps.

Figure 9:
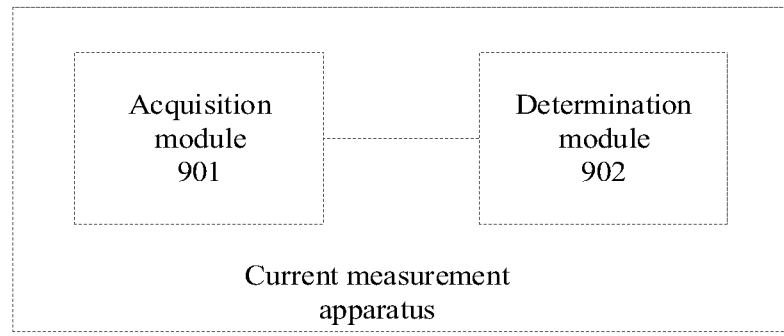
FIG. 9 is a structure block diagram illustrating a current measurement apparatus according to another embodiment.

In an embodiment, as shown in FIG. 9, a current measurement apparatus is provided, including:

an acquisition module 901, configured to acquire magnetic induction intensities of four first uniaxial TMR chips and magnetic induction intensities of at least two second uniaxial TMR chips; a determination module 902, configured to determine the target current value of the to-be-measured wire according to a magnetic induction intensity of each first uniaxial TMR chip, a magnetic induction intensity of each second uniaxial TMR chip, and a radius of a virtual ring.

In the embodiment, the acquisition module is configured to acquire the magnetic induction intensities of four first uniaxial TMR chips and the magnetic induction intensities of at least two second uniaxial TMR chips; the determination module is configured to determine the target current value of the to-be-measured wire according to the magnetic induction intensity of each first uniaxial TMR chip, the magnetic induction intensity of each second uniaxial TMR chip, and the radius of the virtual ring. Since the target current value of the to-be-measured wire can be determined only according to the magnetic induction intensity of each first uniaxial TMR chip, the magnetic induction intensity of each second uniaxial TMR chip, and the radius of the virtual ring at which each uniaxial TMR chip is located, without needing to acquire actual values of other related parameters. Accordingly, the measurement method is simple and effective, and has the anti-interference characteristic because the interference magnetic field parameter is eliminated during the calculation.

In an embodiment, the determination module is specifically configured to substitute the magnetic induction intensity of each first uniaxial TMR chip, the magnetic induction intensity of each second uniaxial TMR chip, and the radius of the virtual ring into a preset current calculation formula, to calculate and obtain the target current value of the to-be-measured wire. The current calculation formula for the target current value includes a corresponding relationship among a magnetic induction intensity variable, a virtual ring radius variable and a current value variable.

Figure 10:
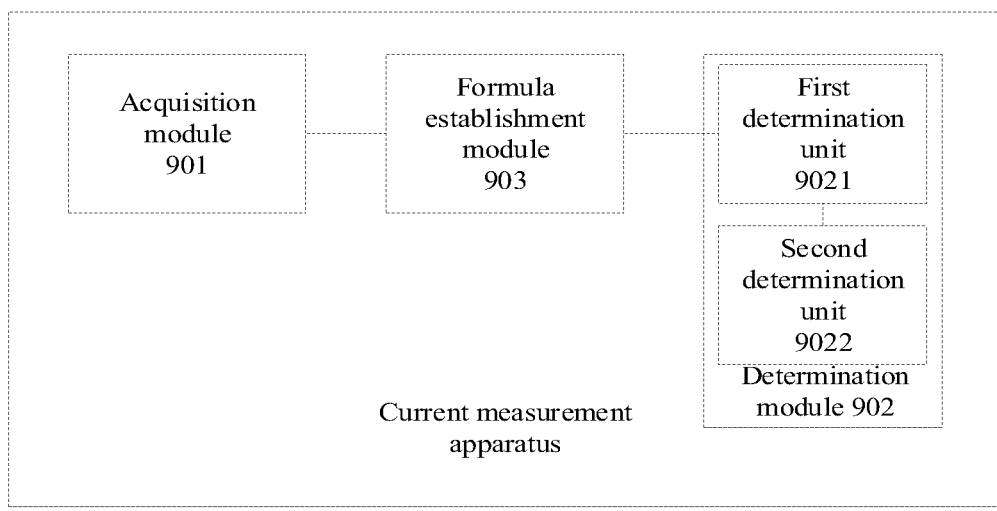
FIG. 10 is a structure block diagram illustrating a current measurement apparatus according to another embodiment.

In an embodiment, as shown in FIG. 10, the current measurement apparatus further includes:

a formula establishment module 903, configured to: acquire a radius included angle parameter between a radius at which each first uniaxial TMR chip is located and a radius at which the to-be-measured wire is located; acquire the first distance parameter between each first uniaxial TMR chip and the to-be-measured wire; acquire the magnetic field included angle parameter between the magnetic field direction of each first uniaxial TMR chip and the corresponding magnetic sensitive direction of each first uniaxial TMR chip; acquire the second distance parameter between the to-be-measured wire and the center of the virtual ring; acquire the interference magnetic field parameter; and establish the current calculation formula for the target current value according to the radius included angle parameter, the first distance parameter, the magnetic field included angle parameter, the second distance parameter, and the interference magnetic field parameter.

In an embodiment, as shown in FIG. 10, the determination module 902 includes: a first determination unit 9021, configured to determine a plurality of candidate current measurement values according to the magnetic induction intensity of each first uniaxial TMR chip, the magnetic induction intensity of each second uniaxial TMR chip, and the radius of the virtual ring; a second determination unit 9022, configured to determine the target current value from the candidate current measurement values.

In an embodiment, the second determination unit is specifically configured to calculate the ratio of the imaginary part to the real part of each candidate current measurement value; if the ratio is less than a preset threshold, the candidate current measurement value is determined as the target current value.

In an embodiment, the second determination unit is specifically configured to: determine the distance between the to-be-measured and the center of the ring corresponding to each candidate current measurement value according to each candidate current measurement value, the magnetic induction intensity of each first uniaxial TMR chip, the magnetic induction intensity of each second uniaxial TMR chip, and the radius of the virtual ring; determine whether the distance between the to-be-measured wire and the center of the ring for the target current value corresponding to each candidate current measurement value is less than R/2, wherein R is the radius of the virtual ring; if the distance between the to-be-measured wire and the center of the ring corresponding to each candidate current measurement value is less than R/2, the candidate current measurement value is determined as the target current value.

For the specific limitations of the current measurement apparatus, reference can be made to the limitations on the current measurement method above, which will not be repeated here. Each module in the above-mentioned current measurement apparatus can be implemented in whole or in part by software, hardware and combinations thereof. The above modules can be embedded in or independent of the processor in the computer device in the form of hardware, or stored in the memory in the computer device in the form of software, so that the processor can call and execute the operations corresponding to the above modules.

In an embodiment, a computer-readable storage medium is provided, on which a computer program is stored, and the steps in the foregoing method embodiment are implemented when the computer program is executed by a processor.

Those of ordinary skill in the art can understand that all or part of the processes in the methods of the above embodiments can be implemented by instructing relevant hardware through a computer program, and the computer program can be stored in a non-transitory computer-readable storage medium; when the computer program is executed, the processes of the above-mentioned method embodiments can be performed. Any reference to a memory, a database or other media used in the various embodiments provided in the present disclosure may include at least one of a non-transitory memory and a transitory memory. The non-transitory memory may include a Read-Only Memory (ROM), a magnetic tape, a floppy disk, a flash memory, an optical memory, a high-density embedded non-transitory memory, a Resistive Random Access Memory (ReRAM), a Magnetoresistive Random Access Memory (MRAM), a Ferroelectric Random Access Memory (FRAM), a Phase Change Memory (PCM), a graphene memory, etc. The transitory memory may include a Random Access Memory (RAM) or an external cache memory, and the like. By way of illustration and not limitation, the RAM may be in various forms, such as a Static Random Access Memory (SRAM) or a Dynamic Random Access Memory (DRAM).

The technical features of the above embodiments can be combined arbitrarily. In order to make the description simple, all possible combinations of the technical features in the above embodiments are not described. However, as long as there is no contradiction in the combination of these technical features, they should be considered to be the scope of the present disclosure.

The above-mentioned embodiments are merely some embodiments of the present disclosure, and the descriptions thereof are relatively specific and detailed, but should not be construed as a limitation on the scope of the present disclosure. It should be noted that those skilled in the art can make several modifications and improvements without departing from the concept of the present disclosure, which all fall within the protection scope of the present disclosure. Therefore, the scope of protection of the present disclosure should be subject to the appended claims.

What is claimed is:

1. A current measurement method, applied to a current measurement device including a current sensor and a processor connected to the current sensor and that is configured to calculate a target current value of a to-be-measured wire according to a magnetic induction intensity and a radius of a virtual ring;
wherein the current sensor includes four first uniaxial Tunnel Magnetoresistance (TMR) chips and two second uniaxial TMR chips, each of the first uniaxial TMR chips and each of the second uniaxial TMR chips is located on the virtual ring, wherein magnetic sensitive directions of the four first uniaxial TMR chips are perpendicular to the radius of the virtual ring, magnetic sensitive directions of two adjacent first uniaxial TMR chips are perpendicular to each other, magnetic sensitive directions of the two second uniaxial TMR chips are parallel to the radius of the virtual ring and opposite to each other, and the two second uniaxial TMR chips respectively have same positions as two of the first uniaxial TMR chips;
wherein each of the first uniaxial TMR chips and each of the second uniaxial TMR chips is configured to collect a magnetic induction intensity, the magnetic induction intensity is configured to calculate a target current value of the to-be-measured wire, the magnetic induction intensity includes a magnetic induction intensity of the to-be-measured wire and an interference magnetic field intensity; the method comprising:
acquiring the magnetic induction intensities of the four first uniaxial TMR chips and the magnetic induction intensities of at least two second uniaxial TMR chips, wherein each of the magnetic induction intensities includes the magnetic induction intensity of the to-be-measured wire and the interference magnetic field intensity; and
determining the target current value of the to-be-measured wire according to the magnetic induction intensity of each first uniaxial TMR chip, the magnetic induction intensity of each second uniaxial TMR chip, and the radius of the virtual ring.

2. The method according to claim 1, wherein the step of determining the target current value of the to-be-measured wire includes:
substituting the magnetic induction intensity of each first uniaxial TMR chip, the magnetic induction intensity of each second uniaxial TMR chip, and the radius of the virtual ring into a preset current calculation formula to calculate and obtain the target current value of the to-be-measured wire, wherein the current calculation formula is a corresponding relationship among a magnetic induction intensity variable, a virtual ring radius variable and a current value variable.

3. The method according to claim 2, wherein an establishment method for the current calculation formula comprises:
acquiring a radius included angle parameter between a radius at which each first uniaxial TMR chip is located and a radius at which the to-be-measured wire is located;
acquiring a first distance parameter between each first uniaxial TMR chip and the to-be-measured wire;
acquiring a magnetic field included angle parameter between a magnetic field direction of each first uniaxial TMR chip and a corresponding magnetic sensitive direction of each first uniaxial TMR chip;
acquiring a second distance parameter between the to-be-measured wire and a center of the virtual ring;
acquiring the interference magnetic field parameter; and
establishing the current calculation formula according to the radius included angle parameter, the first distance parameter, the magnetic field included angle parameter, the second distance parameter, and the interference magnetic field parameter.

4. The method according to claim 1, wherein the step of determining the target current value of the to-be-measured wire includes:
- determining a plurality of candidate current measurement values according to the magnetic induction intensity of each first uniaxial TMR chip, the magnetic induction intensity of each second uniaxial TMR chip, and the radius of the virtual ring; and
- determining the target current value from the plurality of candidate current measurement values.

5. The method according to claim 4, wherein the step of determining the target current value from the plurality of candidate current measurement values includes:
- calculating a ratio of an imaginary part to a real part of each candidate current measurement value; and
- if the ratio is less than a preset threshold value, determining a candidate current measurement value corresponding to the ratio as the target current value.

6. The method according to claim 4, wherein the step of determining the target current value from the plurality of candidate current measurement values includes:
- determining a distance between the to-be-measured wire and the center of the ring corresponding to each candidate current measurement value according to each candidate current measurement value, the magnetic induction intensity of each first uniaxial TMR chip, the magnetic induction intensity of each second uniaxial TMR chip, and the radius of the virtual ring;
- determining whether the distance between the to-be-measured wire and the center of the ring corresponding to each candidate current measurement value is less than R/2, wherein R represents the radius of the virtual ring; and
- if a distance between the to-be-measured wire and the center of the ring corresponding to a candidate current measurement value is less than R/2, determining the candidate current measurement value as the target current value.

7. A computer-readable storage medium, on which a computer program is stored, wherein a processor, when executing the computer program, performs the method of claim 1.

8. A current measurement apparatus, comprising:
- a current measurement device including a current sensor and a processor connected to the current sensor;
- wherein the processor is configured to calculate a target current value of a to-be-measured wire according to a magnetic induction intensity and a radius of a virtual ring;
- wherein the current sensor includes four first uniaxial Tunnel Magnetoresistance (TMR) chips and two second uniaxial TMR chips, each of the first uniaxial TMR chips and each of the second uniaxial TMR chips is located on the virtual ring, wherein magnetic sensitive directions of the four first uniaxial TMR chips are perpendicular to the radius of the virtual ring, magnetic sensitive directions of two adjacent first uniaxial TMR chips are perpendicular to each other, magnetic sensitive directions of the two second uniaxial TMR chips are parallel to the radius of the virtual ring and opposite to each other, and the two second uniaxial TMR chips respectively have the same positions as two of the first uniaxial TMR chips;
- wherein each of the first uniaxial TMR chips and each of the second uniaxial TMR chips is configured to collect a magnetic induction intensity, the magnetic induction intensity is configured to calculate a target current value of the to-be-measured wire, the magnetic induction intensity includes a magnetic induction intensity of the to-be-measured wire and an interference magnetic field intensity;
- an acquisition module, configured to acquire magnetic induction intensities of four first uniaxial TMR chips and magnetic induction intensities of at least two second uniaxial TMR chips; and
- a determination module configured to determine a target current value of the to-be-measured wire according to a magnetic induction intensity of each first uniaxial TMR chip, a magnetic induction intensity of each second uniaxial TMR chip, and a radius of a virtual ring.

* * * * *